United States Patent
Antonakopoulos et al.

(10) Patent No.: US 7,099,257 B2
(45) Date of Patent: Aug. 29, 2006

(54) DATA OVERWRITING IN PROBE-BASED DATA STORAGE DEVICES

(75) Inventors: Theodoros Antonakopoulos, Patras (GR); Gerd K. Binnig, Wollerau (CH); Evangelos S. Eleftheriou, Zurich (CH)

(73) Assignee: International Business Machines Corp, Armonk, NY (US)

( * ) Notice: Subject to any disclaimer, the term of this patent is extended or adjusted under 35 U.S.C. 154(b) by 559 days.

(21) Appl. No.: 10/440,692

(22) Filed: May 19, 2003

(65) Prior Publication Data

US 2004/0233817 A1    Nov. 25, 2004

(51) Int. Cl.
*G11B 7/0045* (2006.01)

(52) U.S. Cl. .................... 369/59.24; 369/126
(58) Field of Classification Search ............ 369/59.24, 369/126
See application file for complete search history.

(56) References Cited

U.S. PATENT DOCUMENTS

| | | | |
|---|---|---|---|
| 5,835,477 A * | 11/1998 | Binnig et al. .......... | 369/126 |
| 6,122,010 A * | 9/2000 | Emelko ................. | 348/461 |
| 2002/0126595 A1* | 9/2002 | Hogan ................... | 369/47.13 |

* cited by examiner

*Primary Examiner*—Hoa T. Nguyen
*Assistant Examiner*—Van T. Pham
(74) *Attorney, Agent, or Firm*—Richard M. Goldman

(57) ABSTRACT

Methods are provided for overwriting data in a probe-based data storage device (1) wherein data is represented by the presence and absence of pits formed in a storage surface (4) by a probe of the device. Input data is first coded such that successive bits of a first value in the coded input data are separated by at least one bit of the other value. Overwrite data bits $v_0, v_1, v_2, \ldots$, are generated from the coded input data bits $b_0, b_1, b_2, \ldots$, and the overwrite data bits $v_0, v_1, v_2, \ldots$, are then used to overwrite data on the storage surface (4). According to a first method, the overwrite data bits are generated such that, if a pit represents a bit of said first value in the data storage device (1) then $v_i = \bar{b}_{i-1}$, for $i \geq 1$ and $v_0$ has said first value, and if a pit represents a bit of said other value in the data storage device (1) then $v_i = b_{i-1}$ for $i \geq 1$ and $v_0$ has said other value. According to a second method, the overwrite data bits are generated such that, if a pit represents a bit of said first value in the data storage device (1) then $v_i = \bar{b}_{i-1}(\bar{b}_{i-2}+b_i)$ for $i \geq 2$, $v_0$ has said first value and $v_1 = \bar{b}_0$, and if a pit represents a bit of said other value in the data storage device (1) then $v_i = \overline{(\bar{b}_{i-1}(\bar{b}_{i-2}+b_i))}$ for $i \geq 2$, $v_0$ has said other value and $v_1 = b_0$. With both methods, the result of the overwrite operation is to record either the coded input data $b_0, b_1, b_2, \ldots$, or its complement $\bar{b}_0, \bar{b}_1, \bar{b}_2, \ldots$, depending on whether a pit represents a bit having the first value or a bit having the other value. This result is independent of the bit values of the data which is overwritten.

54 Claims, 3 Drawing Sheets

| Method 1 | | Method 2 |
|---|---|---|
| ($v_i = \overline{b}_{i-1}$) | | ($v_i = \overline{b}_{i-1}(\overline{b}_{i-2} + b_i)$) |

|  | Method 1 | | Method 2 |
|---|---|---|---|
|  | 0 0 1 0 1 0 0 0 1 0 1 0 0 0 | old data | 0 0 1 0 1 0 0 0 1 0 1 0 0 0 |
|  | 1 0 1 0 1 0 0 1 0 0 1 0 0 1 | new data | 1 0 1 0 1 0 0 1 0 0 1 0 0 1 |
|  | 1 0 1 0 1 0 [1] 0 [1] 0 [1] 1 0 | overwrite pattern | 1 0 1 0 1 0 [0] 1 0 [0] 1 0 [0] 1 0 |
| write: $v_0$ | 1 0 1 0 1 0 0 0 1 0 1 0 0 0 | write: $v_0$ | 1 0 1 0 1 0 0 0 1 0 1 0 0 0 |
| $v_1$ | 1 0 1 0 1 0 0 0 1 0 1 0 0 0 | $v_1$ | 1 0 1 0 1 0 0 0 1 0 1 0 0 0 |
| $v_2$ | 1 0 1 0 1 0 0 0 1 0 1 0 0 0 | $v_2$ | 1 0 1 0 1 0 0 0 1 0 1 0 0 0 |
| $v_3$ | 1 0 1 0 1 0 0 0 1 0 1 0 0 0 | $v_3$ | 1 0 1 0 1 0 0 0 1 0 1 0 0 0 |
| $v_4$ | 1 0 1 0 1 0 0 0 1 0 1 0 0 0 | $v_4$ | 1 0 1 0 1 0 0 0 1 0 1 0 0 0 |
| $v_5$ | 1 0 1 0 1 0 0 0 1 0 1 0 0 0 | $v_5$ | 1 0 1 0 1 0 0 0 1 0 1 0 0 0 |
| $v_6$ | 1 0 1 0 1 0 [1] 0 1 0 1 0 0 0 | $v_6$ | 1 0 1 0 1 0 [0] 0 1 0 1 0 0 0 |
| $v_7$ | 1 0 1 0 1 0 0 0 1 0 1 0 0 0 | $v_7$ | 1 0 1 0 1 0 0 0 1 0 1 0 0 0 |
| $v_8$ | 1 0 1 0 1 0 0 0 1 0 1 0 0 0 | $v_8$ | 1 0 1 0 1 0 0 0 1 0 1 0 0 0 |
| $v_9$ | 1 0 1 0 1 0 0 [1] 0 0 1 0 0 0 | $v_9$ | 1 0 1 0 1 0 0 [0] 0 0 1 0 0 0 |
| $v_{10}$ | 1 0 1 0 1 0 0 1 0 0 1 0 0 0 | $v_{10}$ | 1 0 1 0 1 0 0 1 0 0 1 0 0 0 |
| $v_{11}$ | 1 0 1 0 1 0 0 1 0 0 1 0 0 0 | $v_{11}$ | 1 0 1 0 1 0 0 1 0 0 1 0 0 0 |
| $v_{12}$ | 1 0 1 0 1 0 0 1 0 0 1 [1] 0 | $v_{12}$ | 1 0 1 0 1 0 0 1 0 0 1 [0] 0 |
| $v_{13}$ | 1 0 1 0 1 0 0 1 0 0 1 0 0 1 | $v_{13}$ | 1 0 1 0 1 0 0 1 0 0 1 0 0 1 |

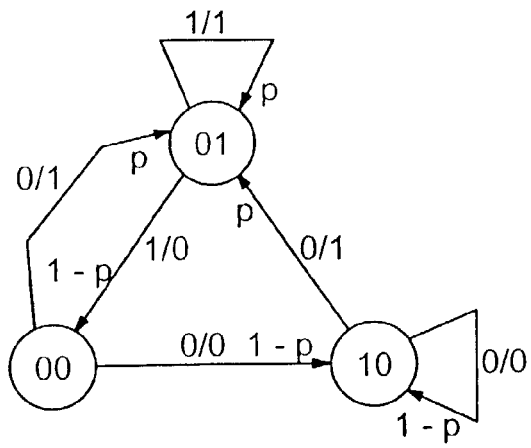
Figure 4a
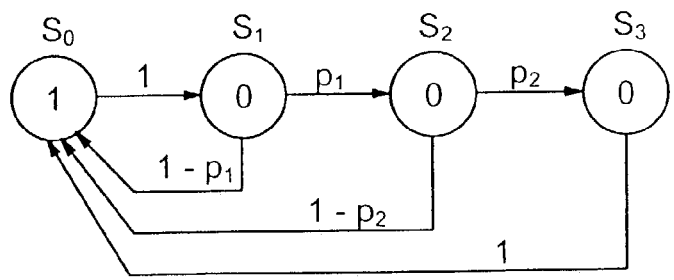
Figure 4b
| Code | (1, 3) Code | (2, 10) Code 1 | (2, 10) Code 2 |
|---|---|---|---|
| Code Rate | 1/2 | 1/2 | 1/2 |
| Areal Density Gain | 1 | 1.5 | 1.5 |
| Reduction of Power Dissipation (%) | 30.00 | 24.41 | 26.84 |
| Number of Write Operations with Method 1 (%) | 62.50 | 80.45 | 78.89 |
| Number of Write Operations with Method 2 (%) | 43.70 | 60.96 | 57.78 |
Figure 5

DATA OVERWRITING IN PROBE-BASED DATA STORAGE DEVICES

This invention relates generally to probe-based data storage devices, and more particularly to overwriting of data in such devices. Embodiments of the invention provide methods and apparatus enabling data to be stored in such devices without first erasing previously-written data.

Probe-based data storage has long been recognized as a possible basis for ultrahigh density data storage. In probe-based data storage devices, stored data is represented on a storage surface by the presence and absence of indentations, or "pits", which are formed in the surface by a probe of the device. For example, in AFM (Atomic Force Microscope)-based storage devices, the probe is a nanometer-sharp tip mounted on the end of a microfabricated cantilever. This tip can be moved over the surface of a storage medium in the form of a polymer substrate. A mechanism is provided for heating the tip, and thus the polymer surface at the point of contact with the tip, allowing the tip to penetrate the surface to create a pit. Such a pit typically represents a bit of value "1", a bit of value "0" being represented by the absence of a pit at a bit position on the storage surface. In a read-scan mode, the thermomechanical probe mechanism can be used to read-back data by detecting the deflection of the cantilever as the tip is moved over the pattern of bit indentations. AFM-based data storage is described in detail in IBM Journal of Research & Development, Volume 44, No. 3, May 2000, pp323–340, "The 'Millipede'—More Than One Thousand Tips for Future AFM Data Storage", Vettiger et al., and the references cited therein. As described in this document, while basic read/write operations can be implemented using a single cantilever probe, in practice an integrated array of individually-addressable cantilevers is employed in order to increase data rates.

A basic write operation in these probe-based storage devices thus involves creation of a pit in the storage surface by a micromechanical probe mechanism. As the pit is created, material is displaced by the probe and deposited in the area around the indentation. In the AFM-based device discussed above for example, melted polymer is deposited in the area around a pit creating "donut walls", or "rings", which have a higher topological profile than the polymer background. If a pit is formed next to an existing pit, the displaced material can partly fill the existing pit, effectively changing a "1" to a "0". The physical mechanism exploited for data storage thus imposes a limit on the smallest distance between pits created during a data write operation. However, when overwriting of old data with new data is contemplated the effects are more complex. For example, since a zero corresponds to "no pit" at a bit position, writing a zero corresponds to no action, so that "writing" a zero over a previously-written "1" at a bit position will leave the "1" in tact. As a further example, writing a "1" at a given bit position can change neighboring, previously-written "1's" to zeros due to displacement of material as described above. Because of such problems, probe-based data storage has heretofore relied on the writing of data on "clean" storage surfaces, i.e. surfaces on which data has not previously been written or from which old data has been erased. For example, in the case of the Millipede device referenced above, old data is erased by heating the storage surface to cause melting and "reflow" of the polymer. Clearly this is both power and time intensive, and it would be highly desirable to provide a system wherein old data can be directly overwritten.

According to one aspect of the present invention there is provided a method for overwriting data in a probe-based data storage device wherein data is represented by the presence and absence of pits formed in a storage surface by a probe of the device. The method comprises:

coding input data such that successive bits of a first value in the coded input data are separated by at least one bit of the other value;

generating overwrite data bits $v_0, v_1, v_2, \ldots$, from the coded input data bits $b_0, b_1, b_2, \ldots$, such that, if a pit represents a bit of said first value in the data storage device then $v_i = \bar{b}_{i-1}$, for $i \geq 1$ and $v_0$ has said first value, and if a pit represents a bit of said other value in the data storage device then $v_i = b_{i-1}$ for $i \geq 1$ and $v_0$ has said other value; and overwriting data on the storage surface with the overwrite data bits.

In embodiments of this aspect of the invention therefore, input data to be stored in the device is first coded to produce the coded input data bits $b_0, b_1, b_2, \ldots$, etc. The coding process employed here ensures that, in the coded bit sequence, successive bits of a particular, "first" value (which may be 0 or 1 in different embodiments) are separated by at least one bit of the other value. An overwrite bit sequence $v_0, v_1, v_2, \ldots$, etc., is then generated from the coded input bit sequence $b_0, b_1, b_2, \ldots$, such that the overwrite sequence satisfies one of two relationships. The appropriate relationship depends on whether a bit of the aforementioned first value is written as a pit or "no-pit" in the storage device. If a pit represents a bit having the first value then $v_i = \bar{b}_{i-1}$ for $i \geq 1$ and $v_0$ has said first value (where the symbol here and throughout signifies bit inversion). If a pit represents a bit of the other value then $v_i = b_{i-1}$ for $i \geq 1$ and $v_0$ has said other value. Either way, the resulting overwrite sequence can then be written on the storage surface over existing data. It will be demonstrated below that, in the case where a pit represents a bit having the aforementioned first value, the resulting bit sequence recorded on the surface will be $b_0, b_1, b_2, \ldots$, etc. In the case where a pit represents a bit having the other value, the resulting bit sequence recorded on the surface will be the complement of $b_0, b_1, b_2, \ldots$, (i.e. the bit-inversion $\bar{b}_0, \bar{b}_1, \bar{b}_2, \ldots$,). Thus, depending on the operating parameters the result of writing the overwrite bit sequence is to record the coded bit sequence $b_0, b_1, b_2, \ldots$, or its complement on the storage surface irrespective of the bit values of the old data which is overwritten. The need to erase old data is therefore eliminated.

According to a second aspect of the invention there is provided a method for overwriting data in a probe-based data storage device wherein data is represented by the presence and absence of pits formed in a storage surface by a probe of the device, the method comprising:

coding input data such that successive bits of a first value in the coded input data are separated by at least one bit of the other value;

generating overwrite data bits $v_0, v_1, v_2, \ldots$, from the coded input data bits $b_0, b_1, b_2, \ldots$, such that, if a pit represents a bit of said first value in the data storage device then $v_i = \bar{b}_{i-1}(\bar{b}_{i-2} + b_i)$ for $i \geq 2$, $v_0$ has said first value and $v_1 = \bar{b}_0$, and if a pit represents a bit of said other value in the data storage device then $v_i = \overline{(\bar{b}_{i-1}(\bar{b}_{i-2} + b_i))}$ for $i \geq 2$, $v_0$ has said other value and $v_1 = b_0$; and overwriting data on the storage surface with the overwrite data bits.

In embodiments of this aspect of the invention, input data is coded as in embodiments of the first aspect of the invention to produce a coded bit sequence $b_0, b_1, b_2, \ldots$, etc. As before, an overwrite bit sequence $v_0, v_1, v_2, \ldots$, etc. is then generated from the coded input bit sequence $b_0, b_1, b_2, \ldots$, such that the overwrite sequence satisfies one of two relationships. Again, the appropriate relationship depends on whether a bit of the aforementioned first value is written as a pit or "no-pit" in the storage device, but the relationships are different here. If a pit represents a bit having the first value then $v_i = \overline{b}_{i-1}(\overline{b}_{i-2} + b_i)$ for $i \geq 2$, $v_0$ has said first value and $v_1 = \overline{b}_0$ (where the equations presented here and throughout are Boolean logic equations in which + signifies a logical OR, multiplication signifies a logical AND, and the symbol ¯ signifies bit inversion as mentioned above). If a pit represents a bit of the other value then $v_i = \overline{(\overline{b}_{i-1}(\overline{b}_{i-2} + b_i))}$ for $i \geq 2$, $v_0$ has said other value and $v_1 = b_0$. Again, it will be demonstrated below that when the overwrite bit sequence is then written on the storage surface, the effect is to record the coded bit sequence $b_0, b_1, b_2, \ldots$, when a pit represents a bit having the first value. When a pit represents a bit having the other value, the effect is to record the complement of the coded input data, i.e. $\overline{b}_0, \overline{b}_1, \overline{b}_2, \ldots$, etc. This is irrespective of the bit values of the old data which is overwritten. Thus, direct overwriting capability is again provided, but with methods embodying this aspect of the invention reduced power consumption can be achieved in the overwrite operation compared to methods embodying the first aspect of the invention. This will be explained below.

In methods embodying both the first and second aspects of the invention, the process of generating the overwrite bit pattern $v_0, v_1, v_2, \ldots$, is based on shifting the pattern to be recorded by one bit position in the direction of the write operation, plus, where necessary depending on the pit/no-pit bit-allocation in the device and the initial input data coding process, bit-inversion of this pattern. Both aspects of the invention are predicated on the realization that, when applied to bit patterns having the property imposed by the initial input data coding, this process provides the basis for overwrite results which are independent of the old data which is overwritten.

While the initial input data coding can be implemented using various codes in the above methods, preferred embodiments utilize codes based on principles of RLL (Run-Length Limited) (d, k) constraint codes. In such codes, the (d, k) constraint signifies that successive 1's in the coded bit sequence are separated by at least "d" zeros and at most "k" zeros. These codes have been employed in optical recording systems, where digitally-stored information is represented in terms of pits and lands, to increase the pit size compared to that of uncoded data and thus increase storage density without sacrificing reliability. Similarly, these codes are used in magnetic recording effectively to maintain the distance between magnetic transitions while "d" no transitions are allowed in-between, thereby increasing linear density. The (d, k) sequence is not applied directly in magnetic or optical recording, but is converted to an RLL sequence by a precoding step and then mapped into bipolar symbols +1 and −1 whereby logical 1's in the (d, k) sequence indicate the positions of +1 to −1 or −1 to +1 transitions. In contrast, in methods embodying the present invention, precoding is not required and (d, k) encoded data (d≧1) can be used directly as the sequence $b_0, b_1, b_2, \ldots$, from which the overwrite sequence $v_0, v_1, v_2, \ldots$, is generated. (Of course, the initial input data coding may prohibit two consecutive "1's" (the aforementioned first value=1) or two consecutive "0's" (the aforementioned first value=0) in the coded input data in different embodiments of the invention. Thus, while "d" and "k" conventionally represent numbers of zeros, in some embodiments of the invention these constraints may apply to the numbers of "1's" allowed between zeros). The use of (d, k) codes for the initial input data coding in preferred embodiments allows the data storage density to be increased, the d constraint ensuring that successive pits to be left in the storage surface after writing a bit sequence will always be separated by at least one "no-pit" As an example, a d=1 and k≧6 constraint guarantees the existence of a code of rate R=2/3. Thus, by using a (1, k≧6) code, the effective pitch (i.e. the distance between bit positions) can be reduced by half while the distance between pits remains the same, thereby increasing linear density by a factor of 4/3. A d=2 and k>6 constraint guarantees the existence of a code of rate R=1/2. Thus, by using a (2, k>6) code, the effective pitch can be reduced to a third while the distance between pits remains the same, thereby increasing linear density by a factor of 3/2. More detailed examples of codes demonstrating an improvement in linear density will be given below.

A third aspect of the invention provides a method for storing data in a probe-based data storage device wherein data is represented by the presence and absence of pits formed in a storage surface by a probe of the device, the method comprising:

coding input data such that successive bits of a first value in the coded input data are separated by at least one bit of the other value;

generating overwrite data bits $v_0, v_1, v_2, \ldots$, from the coded input data bits $b_0, b_1, b_2, \ldots$, such that, if a pit represents a bit of said first value in the data storage device then $v_i = \overline{b}_{i-1}$ for $i \geq 1$ and $v_0$ has said first value, and if a pit represents a bit of said other value in the data storage device then $v_i = b_{i-1}$ for $i \geq 1$ and $v_0$ has said other value;

selecting a write-pattern to be written on the storage surface such that, if a pit represents a bit of said first value in the data storage device then the coded input data is selected as the write-pattern when the write-pattern is to be written on a clean area of the storage surface and the overwrite data bits are selected as the write-pattern when the write-pattern is to overwrite data on the storage surface, and if a pit represents a bit of said other value in the data storage device then the complement of the coded input data is selected as the write-pattern when the write-pattern is to be written on a clean area of the storage surface and the overwrite data bits are selected as the write-pattern when the write-pattern is to overwrite data on the storage surface; and writing the write-pattern on the storage surface.

Similarly, a fourth aspect of the invention provides a method for storing data in a probe-based data storage device wherein data is represented by the presence and absence of pits formed in a storage surface by a probe of the device, the method comprising:

coding input data such that successive bits of a first value in the coded input data are separated by at least one bit of the other value;

generating overwrite data bits $v_0, v_1, v_2, \ldots$, from the coded input data bits $b_0, b_1, b_2, \ldots$, such that, if a pit represents a bit of said first value in the data storage device then $v_i = \overline{b}_{i-1}(\overline{b}_{i-2} + b_i)$ for $i \geq 2$, $v_0$ has said first value and $v_1 = \overline{b}_0$, and if a pit represents a bit of said other value in the data storage device then $v_i = \overline{(\overline{b}_{i-1}(\overline{b}_{i-2} + b_i))}$ for $i \geq 2$, $v_0$ has said other value and $v_1 = b_0$;

selecting a write-pattern to be written on the storage surface such that, if a pit represents a bit of said first value in the data storage device then the coded input data is selected as the write-pattern when the write-pattern is to be written on a clean area of the storage surface and the overwrite data bits are selected as the write-pattern when the write-pattern is to overwrite data on the storage surface, and if a pit represents a bit of said other value in the data storage device then the complement of the coded input data is selected as the write-pattern when the write-pattern is to be written on a clean area of the storage surface and the overwrite data bits are selected as the write-pattern when the write-pattern is to overwrite data on the storage surface; and writing the write-pattern on the storage surface.

Embodiments of the third and fourth aspects of the invention allow the coded input data or its complement (as appropriate depending on whether a bit having said first value is written as a pit or no-pit in the data storage device) to be used directly as the write-pattern when the write-pattern is to be written on a clean (i.e. previously unwritten or erased) area of the storage surface. This results in a further power saving as will be explained below.

A fifth aspect of the invention provides coding apparatus for coding data for storage in a probe-based data storage device wherein data is represented by the presence and absence of pits formed in a storage surface by a probe of the device, the apparatus comprising:

a coder for coding input data to be stored in the device such that successive bits of a first value in the coded input data are separated by at least one bit of the other value;

an overwrite pattern generator for generating from the coded input data bits $b_0, b_1, b_2, \ldots$, overwrite data bits $v_0, v_1, v_2, \ldots$, for overwriting data on the storage surface, the overwrite data bits satisfying one of the relationships $v_i = \overline{b}_{i-1}$ for $i \geq 1$ with $v_0$ having said first value, and $v_i = b_{i-1}$ for $i \geq 1$ with $v_0$ having said other value.

Similarly, a sixth aspect of the invention provides coding apparatus for coding data for storage in a probe-based data storage device wherein data is represented by the presence and absence of pits formed in a storage surface by a probe of the device, the apparatus comprising:

a coder for coding input data to be stored in the device such that successive bits of a first value in the coded input data are separated by at least one bit of the other value;

an overwrite pattern generator for generating from the coded input data bits $b_0, b_1, b_2, \ldots$, overwrite data bits $v_0, v_1, v_2, \ldots$, for overwriting data on the storage surface, the overwrite data bits satisfying one of the relationships $v_i = \overline{b}_{i-1}(\overline{b}_{i-2}+b_i)$ for $i \geq 2$ with $v_0$ having said first value and $v_1 = \overline{b}_0$, and $v_i = \overline{(\overline{b}_{i-1}(\overline{b}_{i-2}+b_i))}$ for $i \geq 2$ with $v_0$ having said other value and $v_1 = b_0$.

Coding apparatus embodying the fifth and sixth aspects of the invention thus generate an overwrite pattern $v_0, v_1, v_2, \ldots$, which can be supplied to a probe mechanism of the storage device for use in overwriting previously written data. In both cases, the overwrite pattern $v_0, v_1, v_2, \ldots$, is derived from the coded input data by one of two relationships. Depending on which relationship is employed in a given embodiment, and whether a bit having said first value is written as a pit or no-pit in the storage device, then it may be necessary to invert the overwrite pattern $v_0, v_1, v_2, \ldots$, in the storage device to achieve the final write-pattern applied to the storage surface.

The invention also provides methods for storage and recovery of data in a probe-based data storage device, wherein data is stored on the storage surface by a method as hereinbefore described, and wherein data read from the storage surface is decoded by one of two methods depending on the pit/no-pit bit allocation in the device. If a pit represents a bit of the aforementioned first value, then the original input data is recovered by performing the inverse of the coding applied to the input data when generating the coded input data $b_0, b_1, b_2, \ldots$, etc. However, if a pit represents a bit of the other value, the original input data is recovered by taking the complement of the data read from the storage surface and then performing the inverse of the input data coding. The invention similarly provides apparatus for coding and decoding data in a probe-based data storage device, the apparatus comprising coding apparatus as hereinbefore described and a decoder for decoding data read from the storage surface, the decoder being arranged to implement the inverse of the code implemented by said coder. Again, depending on the pit/no-pit bit-allocation in the device, it may be necessary, prior to implementing the inverse code, to take the complement of the data read from the storage surface. This step could therefore be performed by the decoder in some embodiments.

The invention also extends to probe based storage devices employing methods and apparatus as hereinbefore described. In particular, a further aspect of the invention provides probe-based data storage apparatus comprising:

a storage surface;

a probe mechanism for storing data on the storage surface by forming pits therein such that data is represented by the presence and absence of pits at bit locations on the surface;

a coder for coding input data to be stored by the apparatus such that successive bits of a first value in the coded input data are separated by at least one bit of the other value; and an overwrite pattern generator for generating overwrite data bits $v_0, v_1, v_2, \ldots$, from the coded input data bits $b_0, b_1, b_2, \ldots$, such that, if a pit represents a bit of said first value then $v_i = \overline{b}_{i-1}$ for $i \geq 1$ and $v_0$ has said first value, and if a pit represents a bit of said other value then $v_i = b_{i-1}$ for $i \geq 1$ and $v_0$ has said other value;

wherein the overwrite data bits are supplied to the probe mechanism in use for overwriting data on the storage surface.

Similarly, another aspect of the invention provides probe-based data storage apparatus comprising:

a storage surface;

a probe mechanism for storing data on the storage surface by forming pits therein such that data is represented by the presence and absence of pits at bit locations on the surface;

a coder for coding input data to be stored by the apparatus such that successive bits of a first value in the coded input data are separated by at least one bit of the other value; and an overwrite pattern generator for generating overwrite data bits $v_0, v_1, v_2, \ldots$, from the coded input data bits $b_0, b_1, b_2, \ldots$, such that, if a pit represents a bit of said first value then $v_i = \overline{b}_{i-1}(\overline{b}_{i-2}+b_i)$ for $i \geq 2$, $v_0$ has said first value and $v_1 = \overline{b}_0$, and if a pit represents a bit of said other value then $v_i = \overline{(\overline{b}_{i-1}(\overline{b}_{i-2}+b_i))}$ for $i \geq 2$, $v_0$ has said other value and $v_1 = b_0$;

wherein the overwrite data bits are supplied to the probe mechanism in use for overwriting data on the storage surface with the overwrite data bits.

In general it is to be understood that, where features are described herein with reference to a method embodying the invention, corresponding features may be provided in apparatus embodying the invention, and vice versa.

Embodiments of the invention will now be described, by way of example, with reference to the accompanying drawings in which:

FIG. 1 is a schematic block diagram of a probe-based data storage device embodying the invention;

FIG. 2 demonstrates the overwrite operation in the FIG. 1 device using two different data overwrite methods embodying the invention;

FIGS. 4a and 4b are state diagrams for one example of a (d, k) code which may be employed in the FIG. 1 device; and FIG. 5 is a table comparing the use of three (d, k) codes which may be employed with the first and second data overwrite methods in embodiments of the invention.

Figure 1:
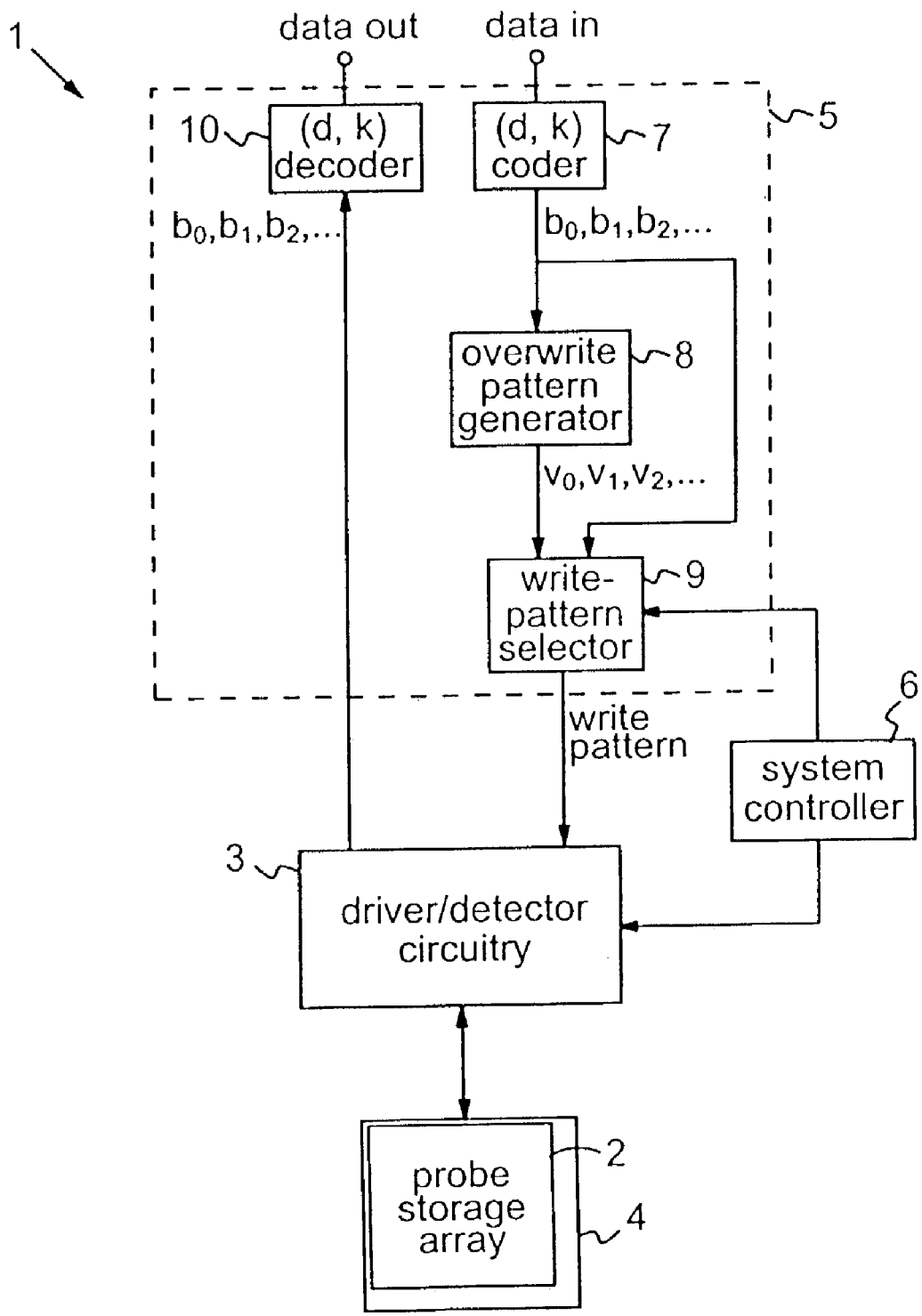

FIG. 1 shows a probe-based storage device 1 embodying the invention. The device 1 includes a probe-storage mechanism which, in this embodiment, comprises a Millipede probe-storage array 2, with associated array driver & detector circuitry 3, of the type described in the document referenced above. Under control of driver/detector circuitry 3, the probe array 2 can thus be used to write and read data on the surface of a polymer storage medium 4. The device 1 also includes coding/decoding apparatus which is indicated generally at 5, and a system controller 6 which controls data write operations of the device as described further below.

The coding portion of coding/decoding apparatus 5 consists of a (d, k) coder 7, an overwrite pattern generator 8 and a write-pattern selector 9 connected as shown in the figure between the data input and the array driver/detector circuitry 3. The decoding portion of coding/decoding apparatus 5 consists of a (d, k) decoder 10 connected between the driver/detector circuitry 3 and the data output.

In operation of the device, input data to be stored is supplied to (d, k) coder 7 which implements a (d, k) code with $d \geq 1$ to generate coded input data $b_0, b_1, b_2, \ldots$, etc. In the present embodiment it is assumed that the (d, k) constraints apply to numbers of zeros, whereby successive 1's in the coded input data $b_0, b_1, b_2, \ldots$, are separated by at least "d" and at most "k" zeros. Particular examples of (d, k) codes which may be employed here will be given below. In general, however, any code which imposes a $d \geq 1$ constraint will allow operation of the overwrite methods to be described hereinafter. The (d, k) coded input data $b_0, b_1, b_2, \ldots$, is supplied to overwrite pattern generator 8 which applies an overwrite function described further below to generate an overwrite bit sequence $v_0, v_1, v_2, \ldots$, etc. This overwrite pattern $v_0, v_1, v_2, \ldots$, is supplied to one input of write-pattern selector 9 which also receives the coded input data $b_0, b_1, b_2, \ldots$, on a second input. The write-pattern selector 9 is responsive to a control input from system controller 6 to select one of the inputs $v_0, v_1, v_2, \ldots$, or $b_0, b_1, b_2, \ldots$, as a write-pattern which is then output to array driver circuitry 3 for writing on storage medium 4. When the write-pattern is to be written on a clean area of the storage surface, controller 6 controls the write-pattern selector to output the coded input data $b_0, b_1, b_2, \ldots$, as the write-pattern. When the write-pattern is to overwrite old data on the storage surface, controller 6 controls the write-pattern selector to output the overwrite pattern $v_0, v_1, v_2, \ldots$, as the write-pattern. Either way, the array driver circuitry 3 then drives probe array 2 to write the write-pattern on the storage surface. In the present embodiment, it is assumed that a "1" in the write-pattern supplied to circuitry 3 is written as a pit on storage medium 4, a "0" in the write-pattern corresponding to "no-pit".

In a first storage method implemented by storage device 1, the overwrite function applied by overwrite pattern generator 8 is given by $v_i = \bar{b}_{i-1}$. Thus, the overwrite pattern is obtained by shifting the coded input data sequence by one bit-position to the right (i.e. in the direction of write order), and inverting the bit values. The overwrite pattern generator 8 here can thus be implemented in logic by a simple 1-bit delay and a NOT gate. Before demonstrating operation of this overwrite method for sample data patterns, it is useful to consider the underlying theory.

The physical mechanism of the probe-based storage system is such that a single-bit overwrite operation can affect the values of three consecutive bits: the current bit, the previous bit (i.e. that at the previous bit position), and the next bit (i.e. that at the next bit position). (For the first and last bits in a row only two bits are affected, but this will be dealt with below). The overwrite operation behaves according to the following rules.

1. If the new bit value=0, then no bit is affected (since a zero corresponds to "no-pit" so "writing" a zero corresponds to no action);

2. If the new bit value=1 and the old bit value at the current bit position=1, then no bit is affected (where it is assumed here that the two neighbor bits of a "1" must be zeros due to the "d" constraint in the coding process described above. In general, however, the data recorded as a result of the overwrite methods described is not dependent on the old, overwritten data satisfying such a constraint).

3. If the new bit value=1 and the old bit value at the current bit position=0, then the new bit will be a "1" and both neighboring bits become "0's". (According to this last rule, two consecutive "1's" are not allowed because the newest "1" would erase the preceding "1").

It follows from these rules that, if:

$d_{i-1}, d_i, d_{i+1}$ are the initial bit values at positions (i−1), (i) and (i+1)

$b_{i-1}, b_i, b_{i+1}$ are the target bit values at positions (i−1), (i) and (i+1)

$v_{i-1}, v_i, v_{i+1}$ is the pattern that has to be used for the overwrite operation $d'_{i-1}, d'_i, d'_{i+1}$ are the final bit values at positions (i−1), (i) and (i+1)

Clearly, $d_i \cdot d_{i+1} = 0$ for all i.

Then, considering three consecutive bits in isolation, the overwrite operation implements the following equations:

$$d'_{i-1} = d_{i-1}(\bar{v}_i + v_i d_i) \quad (1)$$

$$d'_i = v_i + \bar{v}_i d_i \quad (2)$$

$$d'_{i+1} = d_{i+1}(\bar{v}_i + v_i d_i) \quad (3)$$

for $1 \leq i \leq n-1$, where n is the number of useful bits in a row (a spare bit might be needed at the end of a row as discussed further below). For the first bit of a row, the following equations apply:

$$d'_0 = v_0 + \bar{v}_0 d_0 \quad (4)$$

$$d'_1 = d_1(\bar{v}_0 + v_0 d_0) \quad (5)$$

By applying an overwrite sequence of $(v_0, v_1, \ldots v_{n-2}, v_{n-1})$ bits over $(d_0, d_1, \ldots d_{n-2}, d_{n-1})$ bits, the result is $(d'_0, d'_1, \ldots d'_{n-2}, d'_{n-1})$ bits, where:

$$d'_i = v_i \bar{v}_{i+1} + \overline{(v_{i-1} + v_i + v_{i+1})} d_i \quad (6)$$

and $$d'_0 = v_0 \bar{v}_1 + \overline{(v_0 + v_1)} d_0 \quad (7)$$

It can be seen from equations (6) and (7) that $d'_i$ is independent of $d_i$ if at least one of the three (or, for i=0, two) consecutive overwrite bits that affect its value is a "1".

Considering now the overwrite function $v_i=\overline{b}_{i-1}$ for the first overwrite method in the device of FIG. 1, applying this function in equation (6) gives:

$$d'_i=\overline{b}_{i-1}b_i+(b_{i-2}b_{i-1}b_i)d_i$$

But the coded input data $b_0, b_1, \ldots b_{n-2}, b_{n-1}$ is a (d, k) coded sequence with $d \geq 1$, so that two consecutive "1s" are not allowed in the data pattern. Thus, $(b_{i-2}b_{i-1}b_i)$ is always equal to 0, and $d'_i=\overline{b}_{i-1}b_i$, which is independent of $d_i$. The following truth table presents the valid cases for two consecutive bits:

| $b_{i-1}$ | $b_i$ | $\overline{b}_{i-1}b_i$ |
|---|---|---|
| 0 | 0 | 0 |
| 0 | 1 | 1 |
| 1 | 0 | 0 |
| 1 | 1 | invalid |

It can be seen from this table that, $d'_i=b_i$. Thus, when the overwrite pattern $v_0, v_1, v_2, \ldots$, is generated by the overwrite function $v_i=\overline{b}_{i-1}$ in overwrite pattern generator 8, and then written on storage surface 4, the final pattern recorded on the storage surface will be $b_0, b_1, b_2, \ldots$, i.e. the coded input data. This result is independent of the bit values of the old data which is overwritten.

Figures 2, 3:
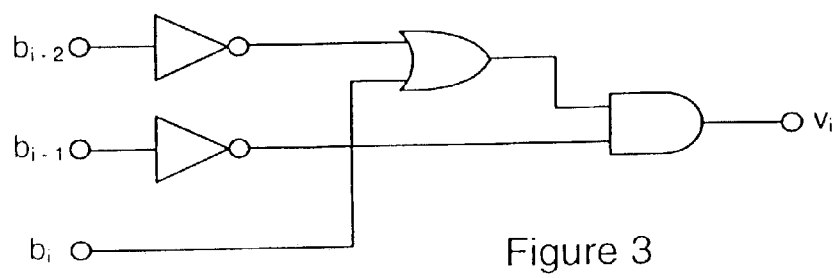
FIG. 3 shows a logic implementation for the overwrite pattern generator of the FIG. 1 device using the second data overwrite method.

The operation of this overwrite method is illustrated by the worked example shown on the left-hand side of FIG. 2. (The significance of the boxes shown around certain bits in this example will be explained later and can be disregarded for the present purposes). The bit pattern at the top of this figure represents an old data pattern which is to be overwritten. The second bit pattern represents the new data which is to be recorded, i.e. the coded input data $b_0, b_1, b_2, \ldots$, output by (d, k) coder 7. The third bit pattern is the overwrite pattern $v_0, v_1, v_2, \ldots$, output by overwrite pattern generator 8 implementing the formula $v_i=\overline{b}_{i-1}$. As a result of the right-shift, the overwrite pattern contains an extra bit at the end of the row, in this case a zero. Also, since there is no bit $b_{-1}$, this bit value is effectively a 0 whereby, in this particular embodiment, $v_i=\overline{b}_{i-1}$ effectively applies also for i=0 in that $v_0$ is always a "1" here. Each of the fourteen bit patterns beneath the overwrite pattern in the figure show the bit pattern as recorded on the storage surface after writing successive bits of the overwrite pattern. Thus, the first of these shows the recorded pattern after $v_0$ is written, the second shows the recorded pattern after $v_1$ is written, and so on. As each bit is written, only the three consecutive bits (two consecutive bits for the first and last patterns) within the area bounded by broken lines in the figure are affected by the write operation. As the write sequence progresses, the old data pattern is gradually transformed into the new data pattern, the new data pattern being completed after writing of $v_{13}$. Note that, because the extra bit ($v_{14}$) at the end of the overwrite pattern is a zero in this case, this last bit can effectively be ignored. However, if $v_{14}$ were a "1" then this bit would be written to complete the write operation. In practice, guard bands will typically be provided around writable sectors on the storage medium to ensure there is space at the beginning and end of a row and avoid interference between data in different sectors. However, if desired in order to reduce storage space, the need for an extra bit could be avoided by employing special coding to ensure that the last two bits of the coded input data, and hence the overwrite pattern, always have complimentary values. The implementation of such an additional coding constraint will be apparent to those skilled in the art.

It will be seen from the foregoing that use of the formula $v_i=\overline{b}_{i-1}$ in the overwrite pattern generator 8 of the storage device 1 allows direct overwriting of data on the storage medium. In addition, the use of (d, k) coding in the storage process enables linear density, and hence areal density, to be increased as discussed above. The decoder 10 of device 1 implements the inverse of the (d, k) code performed by coder 7. Thus, when the coded input data $b_0, b_1, b_2, \ldots$, is subsequently read from the storage surface and supplied to decoder 10, the original input data is recovered as the output data. Moreover, the ability to select the write pattern in selector 9, though not essential, provides a further advantage in terms of power consumption. This can be understood in that power consumption is directly related to the number of pits created in a write operation. In this embodiment, pits correspond to "1's" in the write pattern. The effect of the overwrite function is to convert the (d, k)-constrained strings of zeros in the coded input data into strings of "1's", whereby the overwrite pattern typically contains more "1's" than the coded input data. Hence, power consumption can be reduced by switching to the coded input data as the write pattern when the overwrite facility is not required, i.e. when writing on a clean area of the storage surface.

In a second storage method implemented by storage device 1, the overwrite function applied by overwrite pattern generator 8 is given by $v_i=\overline{b}_{i-1}(\overline{b}_{i-2}+b_i)$. The overwrite pattern generator 8 for this method can be implemented using digital logic gates as shown in FIG. 3. The overwrite pattern generation process here is again based on right-shift and inversion of the coded input data, but the formula used here gives an overwrite pattern with fewer "1's" than the first formula described above. The effect of writing the overwrite pattern produced by this formula is again to record the coded input data $b_0, b_1, b_2, \ldots$, on storage medium 4 as can be seen from the following analysis.

Considering equation (6) above:

$$d'_i=v_i\overline{v}_{i+1}+\overline{(v_{i-1}+v_i+v_{i+1})}d_i$$

the portion $\overline{(v_{i-1}+v_i+v_{i+1})}d_i$ must always be zero if $d'_i$ is to be independent of $d_i$.

By applying the overwrite function $v_i=\overline{b}_{i-1}(\overline{b}_{i-2}+b_i)$ we get:

$$v_{i-1}+v_i+v_{i+1}=\overline{b}_{i-3}\overline{b}_{i-2}+\overline{b}_{i-2}\overline{b}_{i-1}+\overline{b}_{i-1}\overline{b}_i+\overline{b}_ib_{i+1}+\overline{(b_{i-2}b_{i-1})},$$

However, since two consecutive "1's" are prohibited due to the d-constraint:

$$\overline{(b_{i-2}b_{i-1})}=1 \text{ and hence } \overline{(v_{i-1}+v_i+v_{i+1})}=0.$$

Thus, $d'_i=v_i\overline{v}_{i+1}$, and $d'_i$ is always independent of $d_i$

By applying the overwrite formula $v_i=\overline{b}_{i-1}(\overline{b}_{i-2}+b_i)$ it can be proved that: $d'_i=v_i\overline{v}_{i+1}=\overline{b}_{i-2}\overline{b}_{i-1}b_i+\overline{b}_{i-1}b_i$, but $\overline{b}_{i-1}b_i=b_i$ according to the basic truth table given earlier, and finally: $v_i\overline{v}_{i+1}=b_i$. Thus, $d'_i=b_i$, so that, when the overwrite pattern $v_0, v_1, v_2, \ldots$, is generated by the overwrite function $v_i=\overline{b}_{i-1}(\overline{b}_{i-2}+b_i)$ in overwrite pattern generator 8, and then written on storage surface 4, the final pattern recorded on the storage surface will be $b_0, b_1, b_2, \ldots$, i.e. the coded input data. This result is independent of the bit values of the old data which is overwritten.

As noted above, the second overwrite formula results in fewer "1's" in the overwrite pattern than the first overwrite formula. The second formula is based on the recognition that, if the first formula produces an overwrite pattern with k (k>1) consecutive "1's", then only k–1 of these need to be written in order to achieve the correct recorded pattern. In particular, the write operation corresponding to the first "1" in a series of k>1 consecutive "1's" in any overwrite pattern produced by the first formula can be omitted. The effect of the second overwrite formula is thus to produce an overwrite pattern in which the first "1" in any series of two or more consecutive "1's" in the overwrite pattern produced by the first formula is changed to "0". The effect of this can be seen from the worked example shown on the right-hand side of FIG. 2 which demonstrates operation of the second overwrite method for the same old and new data patterns as the first method. The overwrite patterns generated for the two methods differ by the bits marked by boxes in the figure. Where $v_6$, $v_9$ and $v_{12}$ are "1's" in the first overwrite pattern, and are thus written as pits on the storage surface, these bits are changed to "0's" in the second pattern and thus correspond to "no-pits" on the storage surface. Working through the write procedure shows that the final result is the same, however, the final recorded bit sequence being the coded input data $b_0, b_1, b_2, \ldots$, in both cases.

The fact that the result is unchanged by changing the first "1" in a series of two or more consecutive "1's" in an overwrite pattern produced by the first formula to "0" can be understood by considering the effect of bits $v_6$, $v_9$ and $v_{12}$ in the write operation for the first method. Each of these bits is the first "1" in a series of two consecutive "1's" in the overwrite pattern. Each of these is necessarily preceded by a zero, which in turn must be preceded by a 1 due to the d-constraint in the coding process. While each of bits $v_6$, $v_9$ and $v_{12}$ is written as a "1" (i.e. a pit) here, the "1" is always changed to a zero on writing the following "1", i.e. bit $v_7$, $v_{10}$ and $v_{13}$ respectively. The only reason to write bits $v_6$, $v_9$ and $v_{12}$ as "1's" would therefore be to ensure that the recorded bit at the preceding bit position is a zero. This bit is necessarily a zero however because the bit before that is always a "1" due to the d-constraint. The second overwrite formula thus always results in the same final recorded pattern $b_0, b_1, b_2, \ldots$, as the first formula, but requires fewer "1's" in the overwrite pattern. This translates to writing of fewer pits on the storage surface, and hence to reduced power consumption in the overwrite operation.

Note that, in the second overwrite method of FIG. 2, since there are no bits $b_{-1}$ and $b_{-2}$, these bit values are effectively a 0 whereby, in this particular embodiment, $v_0=1$ and $v_1=\overline{b}_0$. Also, the extra bit ($v_{14}$) at the end of the overwrite pattern is a zero here and can be ignored, but the above comments on this extra bit for the first overwrite method apply equally here. As before, when the coded input data $b_0, b_1, b_2, \ldots,$ is subsequently read from the storage surface, the decoder 10 of device 1 implements the inverse of the (d, k) code performed by coder 7 to recover the original input data.

It will be seen from the above that, like the first overwrite method, use of the second overwrite method in storage device 1 allows direct overwriting of data on the storage surface, improved areal density due to the (d, k) coding, together with the power advantages of write-pattern selection as discussed above. In addition, however, overall power consumption in the overwrite operation is reduced as compared to the first method. This reduction in power consumption can be analyzed as follows.

If: $P_w$ is the power dissipation for a single overwrite operation, and $p_{i0}$ is the probability of a pattern of i-consecutive 0s in the target pattern to be recorded, and $p_{11}$ is the probability of the pattern "1" then for any (d, k) code, the total power dissipation for the first overwrite method is:

$$P_{method1} = P_w \sum_{i=d}^{k} i \cdot p_{i0}$$

while the total power dissipation for the second overwrite method is $$P_{method2} = P_w \left( p_{10} + \sum_{i=2}^{k} (i-1) \cdot p_{i0} \right) \text{ for } d = 1, \text{ and}$$

$$P_{method2} = P_w \left( \sum_{i=d}^{k} (i-1) \cdot p_{i0} \right) \text{ for } d > 1$$

Therefore, the power dissipation reduction factor $f_p$ is given by:

$$f_p = \frac{p_{10} + \sum_{i=2}^{k}(i-1) \cdot p_{i0}}{\sum_{i=1}^{k} i \cdot p_{i0}} \text{ for } d = 1, \text{ and}$$

$$f_p = \frac{\sum_{i=d}^{k}(i-1) \cdot p_{i0}}{\sum_{i=d}^{k} i \cdot p_{i0}} \text{ for } d > 1$$

The power effects with three particular (d, k) codes which may be employed in embodiments of the invention will now be demonstrated.

Rate 1/2 (1, 3) Code

Where a (d, k)=(1, 3) code is used, the following number of overwrite operations are performed:

| Target Data to be stored | Write Operations Method 1 | Write Operations Method 2 |
| --- | --- | --- |
| 1 | None | None |
| 0 | One (1) | One (1) |
| 00 | Two (2) | One (1) |
| 000 | Three (3) | Two (2) |

The total power dissipation for the first method is given by:

$$P_{method1} = (p_{10} + 2p_{20} + 3p_{30})P_w$$

while the total power dissipation for the second method is given by:

$$P_{method2} = (p_{10} + p_{20} + 2p_{30})P_w$$

and the power dissipation reduction factor $f_p$ is given by:

$$f_p = \frac{p_{10} + p_{20} + 2p_{30}}{p_{10} + 2p_{20} + 3p_{30}}$$

For the shortest fixed-length block code satisfying the (1, 3) constraints (m=1, n=2, code rate=1/2), the simplified codebook is:

| Source | Code |
|--------|------|
| 0 | X 0 |
| 1 | 0 1 | where "X"="don't care", and the state transmission diagram (previous bit/next bit) is as shown in FIG. 4a. This state diagram is described by:

$$\begin{bmatrix} S_{01} \\ S_{00} \\ S_{10} \end{bmatrix} = \begin{bmatrix} p & p & p \\ 1-p & 0 & 0 \\ 0 & 1-p & 1-p \end{bmatrix} \begin{bmatrix} S_{01} \\ S_{00} \\ S_{10} \end{bmatrix}$$

where the source is considered stationary and memoryless and p is the probability that the value of a raw data bit is equal to 1.

The state probabilities are given by:
Pr(state—01)=$S_{01}$=p
Pr(state—00)=$S_{00}$=p(1-p)
Pr(state—10)=$S_{10}$=(1-p)$^2$ This code state diagram can also be presented using a 4-states diagram which describes the single bit output procedure as shown in FIG. 4b. This state diagram is described by:

$$\begin{bmatrix} S_0 \\ S_1 \\ S_2 \\ S_3 \end{bmatrix} = \begin{bmatrix} 0 & 1-p_1 & 1-p_2 & 1 \\ 1 & 0 & 0 & 0 \\ 0 & p_1 & 0 & 0 \\ 0 & 0 & p_2 & 0 \end{bmatrix} \begin{bmatrix} S_0 \\ S_1 \\ S_2 \\ S_3 \end{bmatrix}$$

and the state probabilities are given by:

$$S_0 = \frac{1}{2+p_1+p_1 p_2} \quad S_1 = \frac{1}{2+p_1+p_1 p_2}$$

$$S_2 = \frac{p_1}{2+p_1+p_1 p_2} \quad S_3 = \frac{p_1 p_2}{2+p_1+p_1 p_2}$$

If
$P_{(01)}$ is the probability that the pattern 01 occurs in the output data,
$P_{(001)}$ is the probability that the pattern 001 occurs in the output data, and
$P_{(0001)}$ is the probability that the pattern 0001 occurs in the output data,
then $$P_{(01)} = S_1(1-p_1) = \frac{1-p_1}{2+p_1+p_1 p_2}$$

$$P_{(001)} = S_1 p_1(1-p_2) = \frac{p_1(1-p_2)}{2+p_1+p_1 p_2}$$

$$P_{(0001)} = S_1 p_1 p_2 = \frac{p_1 p_2}{2+p_1+p_1 p_2}$$

and $2P_{(01)}+3P_{(001)}+4P_{(0001)}=1$ then:

$$p_{10} = P_{(01)} = \frac{1-p_1}{2+p_1+p_1 p_2}$$

$$p_{20} = P_{(001)} = \frac{p_1(1-p_2)}{2+p_1+p_1 p_2}$$

$$p_{30} = P_{(0001)} = \frac{p_1 p_2}{2+p_1+p_1 p_2}$$

$$p_{11} = P_{(01)} + P_{(001)} + P_{(0001)} = \frac{1}{2+p_1+p_1 p_2}$$

and the power dissipation reduction factor $f_p$ becomes:

$$f_p = \frac{1+p_1 p_2}{1+p_1+p_1 p_2}$$

Combining the two state diagrams, we get:

$$S_0 = \frac{1}{2}(1 \cdot S_{01} + 0 \cdot S_{00} + 1 \cdot S_{10}) \Rightarrow 1-p+p^2 = \frac{2}{2+p_1+p_1 p_2}$$

since probabilities of '1's are equal to both state diagrams, and $$P_{(0001)} = (1-p)S_{00} \cdot p \Rightarrow p^2(1-p)^2 = \frac{p_1 p_2}{2+p_1+p_1 p_2}$$

since the pattern '0001' can be met only in ' . . . 010001 . . . ' output data. This expression means that if an input data bit that is equal to 0 forces the system to state-00 and the next input data bit is '1', then the system goes to state '01'. Therefore:

$p_1$=2p(1-p) and $$p_2 = \frac{p(1-p)}{1-p+p^2}$$

Using the above equations, the power dissipation reduction factor $f_p$ is given by:

$$f_p = \frac{(1-p+p^2)+2p^2(1-p)^2}{1+p-p^2}$$

which is equal to 0.7 for random input data (p=0.5). Therefore, using this (1, 3) code and the second overwrite method, 30% less power is required for overwrite operations compared to the first overwrite method.

The (2, 10) Codes

Where a (d, k)=(2, 10) code is used, the following number of overwrite operations are performed:

| Target Data to be stored | Write Operations Method 1 | Write Operations Method 2 |
|---|---|---|
| 1 | None | None |
| 00 | Two (2) | One (1) |
| 000 | Three (3) | Two (2) |
| 0000 | Four (4) | Three (3) |
| 00000 | Five (5) | Four (4) |
| 000000 | Six (6) | Five (5) |
| 0000000 | Seven (7) | Six (6) |
| 00000000 | Eight (8) | Seven (7) |
| 000000000 | Nine (9) | Eight (8) |
| 0000000000 | Ten (10) | Nine (9) | and the power dissipation reduction factor $f_p$ becomes:

$$f_p = \frac{\sum_{i=2}^{10}(i-1) \cdot p_{i0}}{\sum_{i=2}^{10} i \cdot p_{i0}}$$

and its value depends on the $p_{i0}$ probabilities.

In order to estimate the power dissipation reduction factor for (d, k)=(2, 10), two different codes have been developed, the first code (Code 1) is based on 14-bit initial codewords with 2 additional code bits, while the second code (Code 2) is based on 15-bit initial codewords with 1 additional code bit and code violation. It is worth mentioning that any (2, k) code results in an increase of 50% in areal density compared to any (1, k) code.

The Rate 8/16 (2, 10) Code 1

This code is based on 14-bit initial codewords with 2 additional code bits. There are 256 14-bit codewords satisfying the (2, 10) constraint and starting or ending with at most 9 consecutive "0"s. Two additional code bits are then appended according to the following rules:

If $s+t+2 \leq 10$, then insert 0 0
else if $s<2$, then insert 0 1
else insert 1 0 where s is the number of "0"s at the end of a 14-bit codeword and t is the number of "0"s at the beginning of the next 14-bit codeword.

Based on the above codewords, the typical 0-pattern probabilities have been estimated for equally probable input 8-bit raw datawords:

$p_{20}=0.291$
$p_{30}=0.210$
$p_{40}=0.154$
$p_{50}=0.111$
$p_{60}=0.081$
$p_{70}=0.060$
$p_{80}=0.046$
$p_{90}=0.029$
$p_{100}=0.018$ and the typical power dissipation reduction factor becomes: $f_p=0.7559$, while its measured minimum and maximum values (based on the variance of the system for computing average power) are respectively 0.7490 and 0.7617. Therefore, using the (2, 10) Code 1 and the second overwrite method, 24.41% less power is required for overwrite operations compared to the first overwrite method.

The Rate 8/16 (2, 10) Code 2

The (2, 10) Code 2 is based on 15-bit initial codewords with 1 additional code bit. The code construction was aimed at minimizing the frequency of occurrence of 10 consecutive zeros. There are 277 15-bit codewords starting with 0 and satisfying the (2, 10) constraint, and 21 codewords with the maximum number of zeros were eliminated so that the final 256 codewords do not contain the pattern '100000000001'. The encoding process for the sixteenth bit is based on the following rules:

If the codeword ends with 0 0 and the next codeword starts with 0 0, then insert 1
else if the codeword ends with 0 0 and the next codeword starts with 0 1, then insert 0 and invert the first two bits of the next codeword
else if the codeword ends with 1 0 and the next codeword starts with 0 1, then insert 0
else if the codeword ends with 1 0 and the next codeword starts with 0 0, then insert 0 and invert the first bit of the next codeword
else if the codeword ends with 0 0 and the next codeword starts with 0 1, then insert 0 and invert the first two bits of the next codeword
else (in this case the codeword ends with 0 1), insert 0.

Based on the above codewords, the typical 0-pattern probabilities have been estimated for equally probable input 8-bit data words:

$p_{20}=0.314$
$p_{30}=0.252$
$p_{40}=0.164$
$p_{50}=0.106$
$p_{60}=0.069$
$p_{70}=0.044$
$p_{80}=0.028$
$p_{90}=0.018$
$p_{100}=0.005$ and the typical power dissipation reduction factor becomes: $f_p=0.7316$, while its measured minimum and maximum values (again based on variance) are respectively 0.7251 and 0.7385. Therefore, using this (2, 10) code and the second overwrite method, 26.84% less power is required for overwrite operations compared to the first overwrite method.

The results of the above analysis are summarized in the table of FIG. 5. Here, the entries for "Number of Write Operations" relate to the numbers of "1"s to be written on the storage medium. It can be seen from this table that the above (d, k) codes together with the second overwrite method offer the following advantages: if the areal density is not increased, the overwrite procedure power dissipation is reduced by 30%; and areal density can be increased by 50% while the overwrite procedure power dissipation is reduced by either 24.41% or 26.84%.

While particular (d, k) codes have been described by way of example above, other codes providing a d≥1 constraint can of course be employed in embodiments of the invention. (d, k) codes with d=2 are considered to be particularly useful however. In addition, while the storage device 1 employs a Millipede probe storage array in the embodiment described, different probe mechanisms may be employed in other probe-based storage devices embodying the invention. Moreover, the invention encompasses overwrite methods which apply whether a pit represents a "1" or a "0" in the storage device and whether the initial input data coding prohibits two consecutive "1's" or two consecutive "0's" in the coded data. This is because the overwrite methods are essentially based on the "pit/no-pit" binary system. Consideration of the operating principles demonstrates that, in general, if the input data coding prohibits two consecutive bits of a "first value" (whether 1 or 0), the opposite value being a "second value", then the overwrite pattern $v_0$, $v_1$, $v_2$, . . . , written on the storage surface can be generated from the coded input data $b_0$, $b_1$, $b_2$, . . . , as follows:

for the first method, if a pit represents a bit of the first value in the data storage device then $v_i = \overline{b}_{i-1}$ for $i \geq 1$ and $v_0$ has the first value, and if a pit represents a bit of the second value in the data storage device then $v_i = b_{i-1}$ for $i \geq 1$ and $v_0$ has the second value;

for the second method, if a pit represents a bit of the first value in the data storage device then $v_i = \overline{b}_{i-1}(\overline{b}_{i-2} + b_i)$ for $i \geq 2$, $v_0$ has the first value and $v_1 = \overline{b}_0$, and if a pit represents a bit of the second value in the data storage device, then $v_i = \overline{(\overline{b}_{i-1}(\overline{b}_{i-2} + b_i))}$ for $i \geq 2$, $v_0$ has the second value and $v_1 = b_0$.

With both methods, in the case where a pit represents a bit having the second value, it will be seen by considering the write operation that the resulting recorded bit pattern is the complement of the coded input data $b_0$, $b_1$, $b_2$, . . . , etc. That is, the result of the overwrite operation is $\overline{b}_0$, $\overline{b}_1$, $\overline{b}_2$, . . . , etc. In such embodiments, where write-pattern selection is employed as in the example above, the complement of the coded input data is used as the write-pattern when the write-pattern is to be written on a clean area of the storage surface. The write-pattern selector thus inverts the coded input data $b_0$, $b_1$, $b_2$, . . . , in this case, and selects the write-pattern as one of the bit patterns $v_0$, $v_1$, $v_2$, . . . , etc. and $\overline{b}_0$, $\overline{b}_1$, $\overline{b}_2$, . . . , etc. as appropriate in response to the control signal. Also, on data read-back in such embodiments, data is decoded by taking the complement of the data read from the storage surface, and then performing the inverse of the original input data coding, thereby recovering the input data.

While the overwrite pattern generator is conveniently implemented by digital logic gates in the above embodiments, the functionality could of course be implemented in software if desired. Many other changes and modifications can be made to the specific embodiments described above without departing from the scope of the invention.

We claim:

1. A method for overwriting data in a probe-based data storage device wherein data is represented by the presence and absence of pits formed in a storage surface by a probe of the device, the method comprising:
   coding input data such that successive bits of a first value in the coded input data are separated by at least one bit of the other value;
   generating overwrite data bits $v_0$, $v_1$, $v_2$, . . . , from the coded input data bits $b_0$, $b_1$, $b_2$, . . . , such that, if a pit represents a bit of said first value in the data storage device then $v_i = \overline{b}_{i-1}$ for $i \geq 1$ and $v_0$ has said first value, and if a pit represents a bit of said other value in the data storage device then $v_i = b_{i-1}$ for $i \geq 1$ and $v_0$ has said other value; and
   overwriting data on the storage surface with the overwrite data bits.

2. A method according to claim 1 wherein a pit represents a bit of said first value in the data storage device.

3. A method according to claim 1 wherein said first value is "1".

4. A method according to claim 1 wherein the input data is coded such that successive bits of said first value are separated by at least d and at most k bits of the other value, where d and k are predetermined numbers and $d \geq 1$.

5. A method according to claim 4 wherein the input data is coded using a rate 1/2 code with d=1 and k=3.

6. A method according to claim 4 wherein d=2.

7. A method according to claim 6 wherein the input data is coded using a rate 8/16 code with d=2 and k=10.

8. A method for overwriting data in a probe-based data storage device wherein data is represented by the presence and absence of pits formed in a storage surface by a probe of the device, the method comprising:
   coding input data such that successive bits of a first value in the coded input data are separated by at least one bit of the other value;
   generating overwrite data bits $v_0$, $v_1$, $V_2$, . . . , from the coded input data bits $b_0$, $b_1$, $b_2$, . . . , such that, if a pit represents a bit of said first value in the data storage device then $v_1 = \overline{b}_{i-1}(\overline{b}_{i-2} + b_i)$ for $i \geq 2$, $v_0$ has said first value and $v_1 = \overline{b}_0$, and if a pit represents a bit of said other value in the data storage device then $v_i = \overline{(\overline{b}_{i-1}(\overline{b}_{i-2} + b_i))}$ for $i \geq 2$, $v_0$ has said other value and $v_1 = b_0$; and
   overwriting data on the storage surface with the overwrite data bits.

9. A method according to claim 8 wherein a pit represents a bit of said first value in the data storage device.

10. A method according to claim 8 wherein said first value is "1".

11. A method according to claim 8 wherein the input data is coded such that successive bits of said first value are separated by at least d and at most k bits of the other value, where d and k are predetermined numbers and $d \geq 1$.

12. A method according to claim 11 wherein the input data is coded using a rate 1/2 code with d=1 and k=3.

13. A method according to claim 11 wherein d=2.

14. A method according to claim 13 wherein the input data is coded using a rate 8/16 code with d=2 and k=10.

15. A method for storage and recovery of data in a probe-based data storage device wherein data is represented by the presence and absence of pits formed in a storage surface by a probe of the device, the method comprising:
   storing data on the storage surface by coding input data such that successive bits of a first value in the coded input data are separated by at least one bit of the other value, generating overwrite data bits $v_0$, $v_1$, $v_2$, . . . , from the coded input data bits $b_0$, $b_1$, $b_2$, . . . , such that, if a pit represents a bit of said first value in the data storage device then $v_i = \overline{b}_{i-1}$ for $i \geq 1$ and $v_0$ has said first value, and if a pit represents a bit of said other value in the data storage device then $v_i = b_{i-1}$ for $i \geq 1$ and $v_0$ has said other value, and overwriting data on the storage surface with the overwrite data bits; and
   decoding data read from the storage surface by
      if a pit represents a bit of said first value in the data storage device, performing the inverse of the coding applied to the input data to generate said coded input data, and
      if a pit represents a bit of said other value in the data storage device, taking the complement of the data read from the storage surface and then performing the inverse of the coding applied to the input data to generate said coded input data,
   thereby to recover said input data.

16. A method for storage and recovery of data in a probe-based data storage device wherein data is represented by the presence and absence of pits formed in a storage surface by a probe of the device, the method comprising:

storing data on the storage surface by coding input data such that successive bits of a first value in the coded input data are separated by at least one bit of the other value, generating overwrite data bits $v_0, v_1, v_2, \ldots$, from the coded input data bits $b_0, b_1, b_2, \ldots$, such that, if a pit represents a bit of said first value in the data storage device then $v_i = \overline{b}_{i-1}(\overline{b}_{i-2}+b_i)$ for $i \geq 2$, $v_0$ has said first value and $v_1 = \overline{b}_0$, and if a pit represents a bit of said other value in the data storage device then $v_i = \overline{(\overline{b}_{i-1}(\overline{b}_{i-2}+b_i))}$ for $i \geq 2$, $v_0$ has said other value and $v_1 = b_0$, and overwriting data on the storage surface with the overwrite data bits; and decoding data read from the storage surface by
   if a pit represents a bit of said first value in the data storage device, performing the inverse of the coding applied to the input data to generate said coded input data, and
   if a pit represents a bit of said other value in the data storage device, taking the complement of the data read from the storage surface and then performing the inverse of the coding applied to the input data to generate said coded input data,
   thereby to recover said input data.

17. A method for storing data in a probe-based data storage device wherein data is represented by the presence and absence of pits formed in a storage surface by a probe of the device, the method comprising:

coding input data such that successive bits of a first value in the coded input data are separated by at least one bit of the other value;

generating overwrite data bits $v_0, v_1, v_2, \ldots$, from the coded input data bits $b_0, b_1, b_2, \ldots$, such that, if a pit represents a bit of said first value in the data storage device then $v_i = \overline{b}_{i-1}$ for $i \geq 1$ and $v_0$ has said first value, and if a pit represents a bit of said other value in the data storage device then $v_i = b_{i-1}$ for $i \geq 1$ and $v_0$ has said other value;

selecting a write-pattern to be written on the storage surface such that, if a pit represents a bit of said first value in the data storage device then the coded input data is selected as the write-pattern when the write-pattern is to be written on a clean area of the storage surface and the overwrite data bits are selected as the write-pattern when the write-pattern is to overwrite data on the storage surface, and if a pit represents a bit of said other value in the data storage device then the complement of the coded input data is selected as the write-pattern when the write-pattern is to be written on a clean area of the storage surface and the overwrite data bits are selected as the write-pattern when the write-pattern is to overwrite data on the storage surface; and writing the write-pattern on the storage surface.

18. A method for storing data in a probe-based data storage device wherein data is represented by the presence and absence of pits formed in a storage surface by a probe of the device, the method comprising:

coding input data such that successive bits of a first value in the coded input data are separated by at least one bit of the other value;

generating overwrite data bits $v_0, v_1, v_2, \ldots$, from the coded input data bits $b_0, b_1, b_2, \ldots$, such that, if a pit represents a bit of said first value in the data storage device then $v_i = \overline{b}_{i-1}(\overline{b}_{i-2}+b_i)$ for $i \geq 2$, $v_0$ has said first value and $v_1 = \overline{b}_0$, and if a pit represents a bit of said other value in the data storage device then $v_i = \overline{(\overline{b}_{i-1}(\overline{b}_{i-2}+b_i))}$ for $i \geq 2$, $v_0$ has said other value and $v_1 = b_0$;

selecting a write-pattern to be written on the storage surface such that, if a pit represents a bit of said first value in the data storage device then the coded input data is selected as the write-pattern when the write-pattern is to be written on a clean area of the storage surface and the overwrite data bits are selected as the write-pattern when the write-pattern is to overwrite data on the storage surface, and if a pit represents a bit of said other value in the data storage device then the complement of the coded input data is selected as the write-pattern when the write-pattern is to be written on a clean area of the storage surface and the overwrite data bits are selected as the write-pattern when the write-pattern is to overwrite data on the storage surface; and writing the write-pattern on the storage surface.

19. Coding apparatus for coding data for storage in a probe-based data storage device wherein data is represented by the presence and absence of pits formed in a storage surface by a probe of the device, the apparatus comprising:

a coder for coding input data to be stored in the device such that successive bits of a first value in the coded input data are separated by at least one bit of the other value;

an overwrite pattern generator for generating from the coded input data bits $b_0, b_1, b_2, \ldots$, overwrite data bits $v_0, v_1, v_2, \ldots$, for overwriting data on the storage surface, the overwrite data bits satisfying one of the relationships (a) $v_i = \overline{b}_{i-1}$ for $i \geq 1$ with $v_0$ having said first value, and (b) $v_i = b_{i-1}$ for $i \geq 1$ with $v_0$ having said other value.

20. Apparatus according to claim 19 including a write-pattern selector having a pair of inputs connected to receive the coded input data and the overwrite data bits respectively, the selector being responsive to a control signal to select a write-pattern to be written on the storage surface, the selector being arranged such that:

if the overwrite data bits satisfy relationship (a), the selector selects one of the coded input data and overwrite data bits as the write-pattern in response to the control signal; and if the overwrite data bits satisfy relationship (b), the selector selects one of the overwrite data bits and the complement of the coded input data as the write-pattern in response to the control signal.

21. Apparatus according to claim 20 including a controller for generating the control signal such that:

if the overwrite data bits satisfy relationship (a), the coded input data is selected as the write-pattern when the write-pattern is to be written on a clean area of the storage surface and the overwrite data bits are selected as the write-pattern when the write-pattern is to overwrite data on the storage surface; and if the overwrite data bits satisfy relationship (b), the complement of the coded input data is selected as the write-pattern when the write-pattern is to be written on a clean area of the storage surface and the overwrite data bits are selected as the write-pattern when the write-pattern is to overwrite data on the storage surface.

22. Apparatus according to claim 19 wherein the coder is arranged to code the input data such that successive bits of said first value are separated by at least d and at most k bits of the other value, where d and k are predetermined numbers and $d \geq 1$.

23. Apparatus according to claim 22 wherein the coder is arranged to code the input data using a rate 1/2 code with d=1 and k=3.

24. Apparatus according to claim 22 wherein d=2.

25. Apparatus according to claim 24 wherein the coder is arranged to code the input data using a rate 8/16 code with d=2 and k=10.

26. Coding apparatus for coding data for storage in a probe-based data storage device wherein data is represented by the presence and absence of pits formed in a storage surface by a probe of the device, the apparatus comprising:
a coder for coding input data to be stored in the device such that successive bits of a first value in the coded input data are separated by at least one bit of the other value;
an overwrite pattern generator for generating from the coded input data bits $b_0, b_1, b_2, \ldots$, overwrite data bits $v_0, v_1, v_2, \ldots$, for overwriting data on the storage surface, the overwrite data bits satisfying one of the relationships (a) $v_i = \overline{b}_{i-1}(\overline{b}_{i-2} + b_i)$ for $i \geq 2$ with $v_0$ having said first value and $v_1 = \overline{b}_0$, and (b) $v_i = \overline{(\overline{b}_{i-1}(\overline{b}_{i-2} + b_i))}$ for $i \geq 2$ with $v_0$ having said other value and $v_1 = b_0$.

27. Apparatus according to claim 26 including a write-pattern selector having a pair of inputs connected to receive the coded input data and the overwrite data bits respectively, the selector being responsive to a control signal to select a write-pattern to be written on the storage surface, the selector being arranged such that:
if the overwrite data bits satisfy relationship (a), the selector selects one of the coded input data and overwrite data bits as the write-pattern in response to the control signal; and
if the overwrite data bits satisfy relationship (b), the selector selects one of the overwrite data bits and the complement of the coded input data as the write-pattern in response to the control signal.

28. Apparatus according to claim 27 including a controller for generating the control signal such that:
if the overwrite data bits satisfy relationship (a), the coded input data is selected as the write-pattern when the write-pattern is to be written on a clean area of the storage surface and the overwrite data bits are selected as the write-pattern when the write-pattern is to overwrite data on the storage surface; and
if the overwrite data bits satisfy relationship (b), the complement of the coded input data is selected as the write-pattern when the write-pattern is to be written on a clean area of the storage surface and the overwrite data bits are selected as the write-pattern when the write-pattern is to overwrite data on the storage surface.

29. Apparatus according to claim 26 wherein the coder is arranged to code the input data such that successive bits of said first value are separated by at least d and at most k bits of the other value, where d and k are predetermined numbers and $d \geq 1$.

30. Apparatus according to claim 29 wherein the coder is arranged to code the input data using a rate 1/2 code with d=1 and k=3.

31. Apparatus according to claim 29 wherein d=2.

32. Apparatus according to claim 31 wherein the coder is arranged to code the input data using a rate 8/16 code with d=2 and k=10.

33. Apparatus for coding and decoding data in a probe-based data storage device wherein data is represented by the presence and absence of pits formed in a storage surface by a probe of the device, the apparatus comprising:
a coder for coding input data to be stored in the device such that successive bits of a first value in the coded input data are separated by at least one bit of the other value;
an overwrite pattern generator for generating from the coded input data bits $b_0, b_1, b2, \ldots$, overwrite data bits $v_0, v_1, v_2, \ldots$, for overwriting data on the storage surface, the overwrite data bits satisfying one of the relationships $v_i = \overline{b}_{i-1}$ for $i \geq 1$ with $v_0$ having said first value, and $v_i = b_{i-1}$ for $i \geq 1$ with $v_0$ having said other value; and
a decoder for decoding data read from the storage surface, the decoder being arranged to implement the inverse of the code implemented by said coder.

34. Apparatus for coding and decoding data in a probe-based data storage device wherein data is represented by the presence and absence of pits formed in a storage surface by a probe of the device, the apparatus comprising:
a coder for coding input data to be stored in the device such that successive bits of a first value in the coded input data are separated by at least one bit of the other value;
an overwrite pattern generator for generating from the coded input data bits $b_0, b_1, b_2, \ldots$, overwrite data bits $v_0, v_1, v_2, \ldots$, for overwriting data on the storage surface, the overwrite data bits satisfying one of the relationships $v_i = \overline{b}_{i-1}(\overline{b}_{i-2} + b_i)$ for $i \geq 2$ with $v_0$ having said first value and $v_1 = \overline{b}_0$, and $v_i = \overline{(\overline{b}_{i-1}(\overline{b}_{i-2} + b_i))}$ for $i \geq 2$ with $v_0$ having said other value and $v_1 = b_0$; and
a decoder for decoding data read from the storage surface, the decoder being arranged to implement the inverse of the code implemented by said coder.

35. Probe-based data storage apparatus comprising:
a storage surface;
a probe mechanism for storing data on the storage surface by forming pits therein such that data is represented by the presence and absence of pits at bit locations on the surface;
a coder for coding input data to be stored by the apparatus such that successive bits of a first value in the coded input data are separated by at least one bit of the other value; and
an overwrite pattern generator for generating overwrite data bits $v_0, v_1, v_2, \ldots$, from the coded input data bits $b_0, b_1, b_2, \ldots$, such that, if a pit represents a bit of said first value then $v_i = \overline{b}_{i-1}$ for $i \geq 1$ and $v_0$ has said first value, and if a pit represents a bit of said other value then $v_i = b_{i-1}$ for $i \geq 1$ and $v_0$ has said other value;
wherein the overwrite data bits are supplied to the probe mechanism in use for overwriting data on the storage surface.

36. Apparatus according to claim 35 including:
a write-pattern selector having a pair of inputs connected to receive the coded input data and the overwrite data bits respectively, the selector being responsive to a control signal to select a write-pattern for supply to the probe mechanism for writing on the storage surface, the selector being arranged such that, if a pit represents a bit of said first value then one of the coded input data and overwrite data bits is selected as the write-pattern in response to the control signal, and if a pit represents a bit of said other value then one of the overwrite data bits and the complement of the coded input data is selected as the write-pattern in response to the control signal; and a controller for generating the control signal such that, if a pit represents a bit of said first value then the coded input data is selected as the write-pattern when the write-pattern is to be written on a clean area of the storage surface and the overwrite data bits are selected as the write-pattern when the write-pattern is to overwrite data on the storage surface, and if a pit represents a bit of said other value then the complement of the coded input data is selected as the write-pattern when the write-pattern is to be written on a clean area of the storage surface and the overwrite data bits are selected as the write-pattern when the write-pattern is to overwrite data on the storage surface.

37. Apparatus according to claim 35 including a decoder for decoding data read from the storage surface, the decoder being arranged to recover the input data by:
   if a pit represents a bit of said first value, performing the inverse of the coding applied to the input data to generate said coded input data; and
   if a pit represents a bit of said other value, taking the complement of the data read from the storage surface and then performing the inverse of the coding applied to the input data to generate said coded input data.

38. Apparatus according to claim 35 wherein the probe mechanism comprises a plurality of individually-addressable probes for writing data on the storage surface.

39. Apparatus according to claim 35 wherein a pit represents a bit of said first value in the data storage apparatus.

40. Apparatus according to claim 35 wherein said first value is "1".

41. Apparatus according to claim 35 wherein the coder is arranged to code the input data such that successive bits of said first value are separated by at least d and at most k bits of the other value, where d and k are predetermined numbers and $d \geq 1$.

42. Apparatus according to claim 41 wherein the coder is arranged to code the input data using a rate 1/2 code with d=1 and k=3.

43. Apparatus according to claim 41 wherein d=2.

44. Apparatus according to claim 43 wherein the coder is arranged to code the input data using a rate 8/16 code with d=2 and k=10.

45. Probe-based data storage apparatus comprising:
   a storage surface;
   a probe mechanism for storing data on the storage surface by forming pits therein such that data is represented by the presence and absence of pits at bit locations on the surface;
   a coder for coding input data to be stored by the apparatus such that successive bits of a first value in the coded input data are separated by at least one bit of the other value; and
   an overwrite pattern generator for generating overwrite data bits $v_0, v_1, v_2, \ldots$, from the coded input data bits $b_0, b_1, b_2, \ldots$, such that, if a pit represents a bit of said first value then $v_i = \overline{b}_{i-1}(\overline{b}_{i-2}+b_i)$ for $i \geq 2$, $v_0$ has said first value and $v_1 = \overline{b}_0$, and if a pit represents a bit of said other value then $v_i = \overline{(\overline{b}_{i-1}(\overline{b}_{i-2}+b_i))}$ for $i \geq 2$, $v_0$ has said other value and $v_1 = b_0$;

wherein the overwrite data bits are supplied to the probe mechanism in use for overwriting data on the storage surface with the overwrite data bits.

46. Apparatus according to claim 45 including:
   a write-pattern selector having a pair of inputs connected to receive the coded input data and the overwrite data bits respectively, the selector being responsive to a control signal to select a write-pattern for supply to the probe mechanism for writing on the storage surface, the selector being arranged such that, if a pit represents a bit of said first value then one of the coded input data and overwrite data bits is selected as the write-pattern in response to the control signal, and if a pit represents a bit of said other value then one of the overwrite data bits and the complement of the coded input data is selected as the write-pattern in response to the control signal; and a controller for generating the control signal such that, if a pit represents a bit of said first value then the coded input data is selected as the write-pattern when the write-pattern is to be written on a clean area of the storage surface and the overwrite data bits are selected as the write-pattern when the write-pattern is to overwrite data on the storage surface, and if a pit represents a bit of said other value then the complement of the coded input data is selected as the write-pattern when the write-pattern is to be written on a clean area of the storage surface and the overwrite data bits are selected as the write-pattern when the write-pattern is to overwrite data on the storage surface.

47. Apparatus according to claim 45 including a decoder for decoding data read from the storage surface, the decoder being arranged to recover the input data by:
   if a pit represents a bit of said first value, performing the inverse of the coding applied to the input data to generate said coded input data; and
   if a pit represents a bit of said other value, taking the complement of the data read from the storage surface and then performing the inverse of the coding applied to the input data to generate said coded input data.

48. Apparatus according to claim 45 wherein the probe mechanism comprises a plurality of individually-addressable probes for writing data on the storage surface.

49. Apparatus according to claim 45 wherein a pit represents a bit of said first value in the data storage apparatus.

50. Apparatus according to claim 45 wherein said first value is "1".

51. Apparatus according to claim 45 wherein the coder is arranged to code the input data such that successive bits of said first value are separated by at least d and at most k bits of the other value, where d and k are predetermined numbers and $d \geq 1$.

52. Apparatus according to claim 51 wherein the coder is arranged to code the input data using a rate 1/2 code with d=1 and k=3.

53. Apparatus according to claim 51 wherein d=2.

54. Apparatus according to claim 53 wherein the coder is arranged to code the input data using a rate 8/16 code with d=2 and k=10.

* * * * *